(12) United States Patent
Tamaki (10) Patent No.: US 9,391,071 B2
(45) Date of Patent: Jul. 12, 2016

(54) SEMICONDUCTOR DEVICE (71) Applicant: KABUSHIKI KAISHA TOSHIBA, Tokyo (JP)

(72) Inventor: Tomohiro Tamaki, Nonoichi Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/634,360

(22) Filed: Feb. 27, 2015

(65) Prior Publication Data
US 2016/0079236 A1    Mar. 17, 2016

(30) Foreign Application Priority Data
Sep. 12, 2014   (JP) ................................ 2014-187113

(51) Int. Cl.
*H01L 27/06*    (2006.01)
*H01L 29/739*   (2006.01)
*H01L 29/861*   (2006.01)
*H01L 29/10*    (2006.01)
*H01L 29/06*    (2006.01)

(52) U.S. Cl.
CPC ........ *H01L 27/0635* (2013.01); *H01L 29/0696* (2013.01); *H01L 29/1095* (2013.01); *H01L 29/7397* (2013.01); *H01L 29/861* (2013.01)

(58) Field of Classification Search
USPC ....................................................... 257/140
See application file for complete search history.

(56) References Cited

U.S. PATENT DOCUMENTS

| | | | | |
|---|---|---|---|---|
| 5,977,569 A | * | 11/1999 | Li | ........................ H03K 17/567 257/119 |
| 7,612,388 B2 | * | 11/2009 | Bauer | ................. H01L 29/1016 257/107 |
| 2011/0193131 A1 | * | 8/2011 | Blanchard | ........... H01L 29/0839 257/139 |
| 2014/0034995 A1 | * | 2/2014 | Akiyama | ............ H01L 29/7455 257/119 |

FOREIGN PATENT DOCUMENTS

| | | |
|---|---|---|
| JP | 5320679 | 10/2013 |
| JP | 2013-235891 | 11/2013 |
| WO | 2013168366 | 11/2013 |

OTHER PUBLICATIONS

M. Rahimo et al., "The Field Charge Extraction (FCE) Diode a Novel Technology for Soft Recovery High Voltage Diodes", ISPSD 2005, pp. 83-86, 2005.

* cited by examiner

*Primary Examiner* — Thao P Le
(74) *Attorney, Agent, or Firm* — Patterson & Sheridan, LLP (57) ABSTRACT

A semiconductor device includes a first semiconductor region of a first conductivity type, a second semiconductor region of a second conductivity type, a third semiconductor region of the first conductivity type, a fourth semiconductor region of the first conductivity type, a fifth semiconductor region of the first conductivity type provided on the third semiconductor region and the fourth semiconductor region, and a sixth semiconductor region of the second conductivity type. The third semiconductor region is provided on the first semiconductor region and has a dopant concentration that is lower than a dopant concentration of the first semiconductor region. The fourth semiconductor region is provided on the second semiconductor region adjacent to the third semiconductor region. A dopant contained in the fourth semiconductor region extends to a level that is deeper than a level of a dopant contained in the third semiconductor region.

20 Claims, 7 Drawing Sheets

SEMICONDUCTOR DEVICE

CROSS-REFERENCE TO RELATED APPLICATION

This application is based upon and claims the benefit of priority from Japanese Patent Application No. 2014-187113, filed Sep. 12, 2014, the entire contents of which are incorporated herein by reference.

FIELD

Embodiments described herein relate generally to a semiconductor device.

BACKGROUND

A semiconductor device known in the art as a reverse conducting insulated gate bipolar transistor (RC-IGBT), is a semiconductor device that functions as an IGBT and as a free wheel diode (FWD) concurrently.

In such a semiconductor device, reducing a temperature dependence of on-resistance of the device is desired.

DETAILED DESCRIPTION

Embodiments provide a semiconductor device which may reduce temperature dependence of an on-resistance.

In general, according to one embodiment, a semiconductor device, includes a first semiconductor region of a first conductivity type, a second semiconductor region of a second conductivity type, a third semiconductor region of the first conductivity type, a fourth semiconductor region of the first conductivity type, a fifth semiconductor region of the first conductivity type, and a sixth semiconductor region the a second conductivity type.

The second semiconductor region is adjacent to the first semiconductor region.

The third semiconductor region is provided on the first semiconductor region. A dopant concentration of the third semiconductor region is lower than a dopant concentration of the first semiconductor region.

The fourth semiconductor region is provided on the second semiconductor region. The fourth semiconductor region is adjacent to the third semiconductor region. A dopant contained in the fourth semiconductor region extends to a level deeper than a dopant contained in the third semiconductor region.

The fifth semiconductor region is provided on the third semiconductor region and the fourth semiconductor region.

The sixth semiconductor region is provided on the fifth semiconductor region.

Hereinafter, each exemplary embodiment will be described with reference to drawings.

The drawings are schematic or conceptual, such that a relationship between a thickness and a width of each portion, and a size ratio between portions are not necessarily the same as an actual device. Moreover, when representing the same portions, dimensions and ratios may be represented differently in the drawings.

In the exemplary embodiment and each drawing, the same reference numerals are applied to similar elements that may have been described in a previous drawing, and a repeated description will be omitted herein for brevity.

In the description of each embodiment, the first conductivity type is an n-type, and the second conductivity type is a p-type is described. However, the first conductivity type may be set to a p-type, and the second conductivity type may be set to an n-type.

In the following description, notations such as $n^+$, $n$, $n^-$, $p^+$, and $p^-$ represents the relative magnitude of a dopant concentration of each conductivity type. That is, $n^+$ indicates an n-type dopant concentration relatively higher than n, $n^-$ indicates the n-type dopant concentration relatively lower than n. In addition, $p^+$ indicates a p-type dopant concentration relatively higher than $p^-$.

First Embodiment

Figure 1:
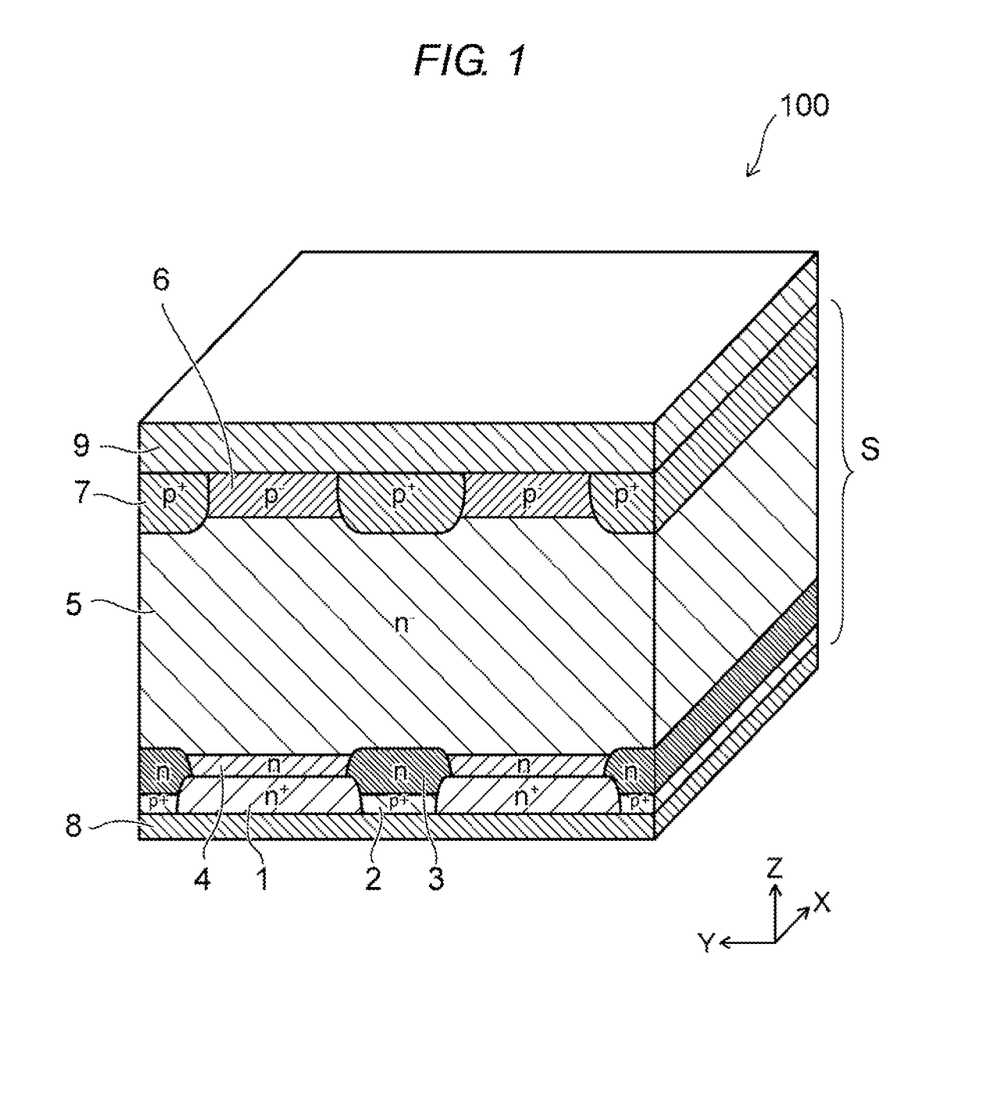
FIG. 1 is a perspective cross-sectional view which illustrates a portion of a semiconductor device according to a first embodiment.

FIG. 1 is a perspective cross-sectional view which illustrates apart of a semiconductor device 100 according to a first embodiment.

The semiconductor device 100 is, for example, a diode.

The semiconductor device 100 includes a semiconductor substrate S (hereinafter, simply referred to as a substrate S), a first electrode (cathode electrode 8), and a second electrode (anode electrode 9).

The substrate S includes a first semiconductor region of a first conductivity type ($n^+$-type semiconductor region 1), a third semiconductor region of a first conductivity type (n-type semiconductor region 4), a fourth semiconductor region of a first conductivity type (n-type semiconductor region 3), and a fifth semiconductor region of a first conductivity type ($n^-$-type semiconductor region 5) which configures a cathode of the diode (the semiconductor device 100). The substrate S also includes a sixth semiconductor region of a second conductivity type ($p^+$-type semiconductor region 7) and a seventh semiconductor region of a second conductivity type ($p^-$-type semiconductor region 6) which configures an anode of the diode (the semiconductor device 100), and the second semiconductor region of a second conductivity type ($p^+$-type semiconductor region 2) provided at a cathode side of the diode.

The substrate S includes a first main surface (front surface) and a second main surface (rear surface).

The cathode electrode 8 is an electrode which is formed, for example, on a rear surface of the substrate S.

The $n^+$-type semiconductor region 1 is an $n^+$-type semiconductor region which is selectively formed at the rear surface side of the substrate S. The $n^+$-type semiconductor region 1 is electrically connected to the cathode electrode 8.

The $n^+$-type semiconductor region 1 contains, for example, a phosphorus (P) or arsenic (As) as a dopant.

The $p^+$-type semiconductor region 2 is selectively formed at the rear surface side of the substrate S. The $p^+$-type semiconductor region 2 is electrically connected to the cathode electrode 8. The p$^+$-type semiconductor region 2 is formed between the n$^+$-type semiconductor regions 1.

The p$^+$-type semiconductor region 2 contains, for example, boron (B) as a dopant.

A plurality of the n$^+$-type semiconductor regions 1 are formed, for example, in a Y direction (first direction) from the n$^+$-type semiconductor region 1 to the p$^+$-type semiconductor region 2. In addition, the n$^+$-type semiconductor regions 1 are parallel to a front surface of the substrate S, and extend in an X direction orthogonal to the Y direction.

A plurality of the p$^+$-type semiconductor regions 2 are formed, for example, in the Y direction. In addition, the p$^+$-type semiconductor regions 2 extend in the X direction.

The n-type semiconductor region 4 is formed on the n$^+$-type semiconductor region 1 at the rear surface side of the substrate S. The n-type semiconductor region 4 is adjacent to (stacked on) the n$^+$-type semiconductor region 1. A plurality of the n-type semiconductor regions 4 are formed in the Y direction. In addition, the n-type semiconductor regions 4 extend in the X direction. A dopant concentration of a first conductivity type of the n-type semiconductor region 4 is lower than a dopant concentration of a first conductivity type of the n$^+$-type semiconductor region 1. Moreover, the dopant concentration of a first conductivity type of the n-type semiconductor region 4 is higher than a dopant concentration of a first conductivity type of the n$^-$-type semiconductor region 5 to be described.

The n-type semiconductor region 4 includes, for example, P or As as a dopant.

The n-type semiconductor region 3 is formed on the p$^+$-type semiconductor region 2 at the rear surface side of the substrate S. The n-type semiconductor region 3 is adjacent to (stacked on) the p$^+$-type semiconductor region 2 in a Z direction (second direction) along the direction of the n$^+$-type semiconductor region 1 to the n-type semiconductor region 4. The Z direction in the embodiment is orthogonal to the X direction and the Y direction. A plurality of the n-type semiconductor regions 3 are formed in the Y direction. In addition, the n-type semiconductor regions 3 extend in the X direction. The n-type semiconductor region 3 is formed between adjacent n-type semiconductor regions 4 in the Y direction. A dopant concentration of a first conductivity type of the n-type semiconductor region 3 is lower than a dopant concentration of a first conductivity type of the n$^+$-type semiconductor region 1.

The n-type semiconductor region 3 and the n-type semiconductor region 4 function as a field stop region terminating in a depletion layer which extends from the n$^-$-type semiconductor region 5 to the n-type semiconductor region 3 and the n-type semiconductor region 4.

The n-type semiconductor region 3 contains a dopant that is implanted at a higher energy level, and also extends deeper into the n-type semiconductor region 3 than a dopant contained in the n-type semiconductor region 4.

As an example, when the n-type semiconductor region 4 is a region containing P as a dopant, the n-type semiconductor region 3 contains a dopant having a higher energy level than P. In this case, a donor level of P is 45 meV, and the n-type semiconductor region 3 contains a dopant which has a donor level greater than 45 meV, such as tellurium (Te), titanium (Ti), carbon (C), magnesium (Mg), selenium (Se), chromium (Cr), tantalum (Ta), cesium (Cs), barium (Ba), or sulfur (S). Among these elements, for example, S has two donor levels of 260 meV and 480 meV, and Se has two donor levels of 250 meV and 400 meV.

A dimension (width) of the n-type semiconductor region 3 in the Y direction is greater (wider) than a dimension (width) of the p$^+$-type semiconductor region 2 in the Y direction. That is, the p$^+$-type semiconductor region 2 be completely covered by the n-type semiconductor region 3 when viewing the n-type semiconductor region 3 and the p$^+$-type semiconductor region 2 from the side of the anode electrode 9.

Accordingly, a portion of the n-type semiconductor region 3 may be formed on the n$^+$-type semiconductor region 1 on both sides of the n-type semiconductor region 3.

In the exemplary embodiment, the n-type semiconductor region 3 extends further in the Z direction than the n-type semiconductor region 4. That is, a surface portion of the n-type semiconductor region 3 extends beyond a plane of a surface portion of the n-type semiconductor region 4.

The n$^-$-type semiconductor region 5 is formed on the n-type semiconductor region 3 and the n-type semiconductor region 4. A dopant concentration of a first conductivity type of the n$^-$-type semiconductor region 5 is lower than, for example, a dopant concentration of a first conductivity type of the n-type semiconductor region 3 and the impurity concentration of a first conductivity type of the n-type semiconductor region 4.

The p$^-$-type semiconductor region 6 is selectively formed on the n$^-$-type semiconductor region 5 at the front surface side of the substrate S. A plurality of the p$^-$-type semiconductor regions 6 are formed in the Y direction. In addition, the p$^-$-type semiconductor regions 6 extend in the X direction.

The p$^+$-type semiconductor region 7 is selectively formed on the n$^-$-type semiconductor region 5 at the front surface side of the substrate S. A plurality of the p$^+$-type semiconductor regions 7 are formed in the Y direction. In addition, the p$^+$-type semiconductor regions 7 extend in the X direction. The p$^-$-type semiconductor region 6 is formed between the adjacent p$^+$-type semiconductor regions in the Y direction. A dopant concentration of a second conductivity type of the p$^+$-type semiconductor region 7 is higher than a dopant concentration of a second conductivity type of the p$^-$-type semiconductor region 6. Moreover, a dopant concentration of a second conductivity type of the p$^+$-type semiconductor region 7 is higher than a dopant concentration of a first conductivity type of the n$^-$-type semiconductor region 5.

The p$^+$-type semiconductor region 7 extends further toward the cathode electrode 8 and into the n$^-$-type semiconductor region 5 as compared to the p$^-$-type semiconductor region 6 in a direction opposite to the Z direction (−Z direction). That is, a surface portion of the p$^+$-type semiconductor region 7 extends beyond a plane of the p$^-$-type semiconductor region 6 in the −Z direction.

The p$^+$-type semiconductor region 7 opposes the n-type semiconductor region 3 through the n$^-$-type semiconductor region 5 in the Z direction. A portion of the p$^+$-type semiconductor region 7 may oppose a portion of the n-type semiconductor region 4 through the n$^-$-type semiconductor region 5 in the Z direction.

Without providing the p$^-$-type semiconductor region 6, an entire region between the n$^-$-type semiconductor region 5 and the anode electrode 9 may be set to be the p$^+$-type semiconductor region 7.

The anode electrode 9 is an electrode which is provided on the front surface of the substrate S. The anode electrode 9 is electrically connected to the p$^-$-type semiconductor region 6 and the p$^+$-type semiconductor region 7.

In the configuration described above, a direction in which the n$^+$-type semiconductor region 1, the p$^+$-type semiconductor region 2, the n-type semiconductor region 3, and the n-type semiconductor region 4 extend in an XY plane may be different from a direction in which the p⁻-type semiconductor region 6 and the p⁺-type semiconductor region 7 extend in an XY plane. For example, the n⁺-type semiconductor region 1, the p⁺-type semiconductor region 2, the n-type semiconductor region 3, and the n-type semiconductor region 4 may extend in a direction orthogonal to the direction in which the p⁻-type semiconductor region 6 and the p⁺-type semiconductor region 7 extend in the XY plane.

Instead of the configuration described above, the n⁺-type semiconductor region 1 is a region extending in the X direction and the Y direction. The p⁺-type semiconductor region 2 may be a region which is interspersed as discrete regions in the X direction and the Y direction in the n⁺-type semiconductor region 1. According to this embodiment, the n⁺-type semiconductor region 1 includes a plurality of n⁺-type semiconductor regions 1a formed between each pair of adjacent p⁺-type semiconductor regions 2.

Figure 2:
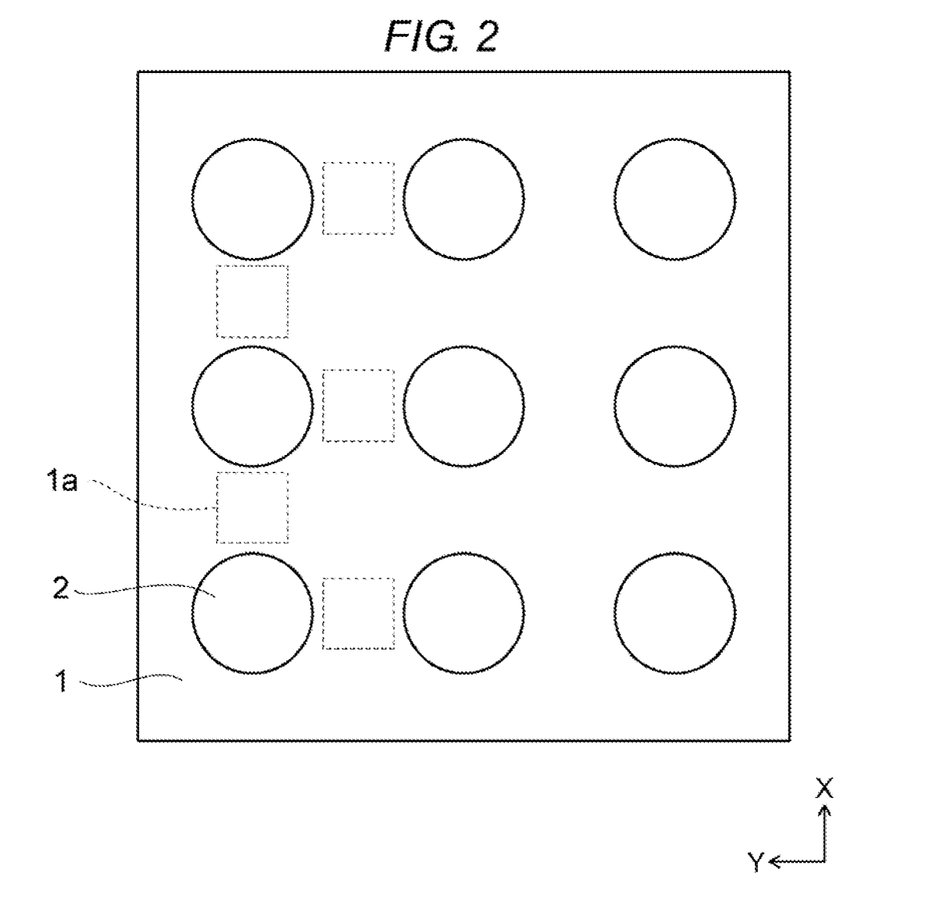
FIG. 2 is a bottom view which illustrates a portion of the semiconductor device according to the first embodiment.

A structure according to this embodiment, when viewing the n⁺-type semiconductor region 1 and the p⁺-type semiconductor region 2 from the side of the cathode electrode 8, is illustrated in FIG. 2. In the structure illustrated in FIG. 2, the n-type semiconductor region 4 overlies the n⁺-type semiconductor region 1 and extends in the X direction and the Y direction in the same orientation as the n⁺-type semiconductor region 1. The n-type semiconductor region is adjacent to the n-type semiconductor region 4 and is interspersed in discrete regions in the X direction and the Y direction in the same manner as the p⁺-type semiconductor region 2. The n-type semiconductor region 4 includes a plurality of n-type semiconductor regions formed between the plurality of n-type semiconductor regions 3 in the same manner as the n⁺-type semiconductor region 1.

The p⁻-type semiconductor region 6 may also be a region extending in the X direction and the Y direction in the same orientation as the n⁺-type semiconductor region 1. According to this embodiment, the p⁺-type semiconductor region 7 is a region which is interspersed in discrete regions in the X direction and the Y direction in the p⁻-type semiconductor region 6.

Figure 3:
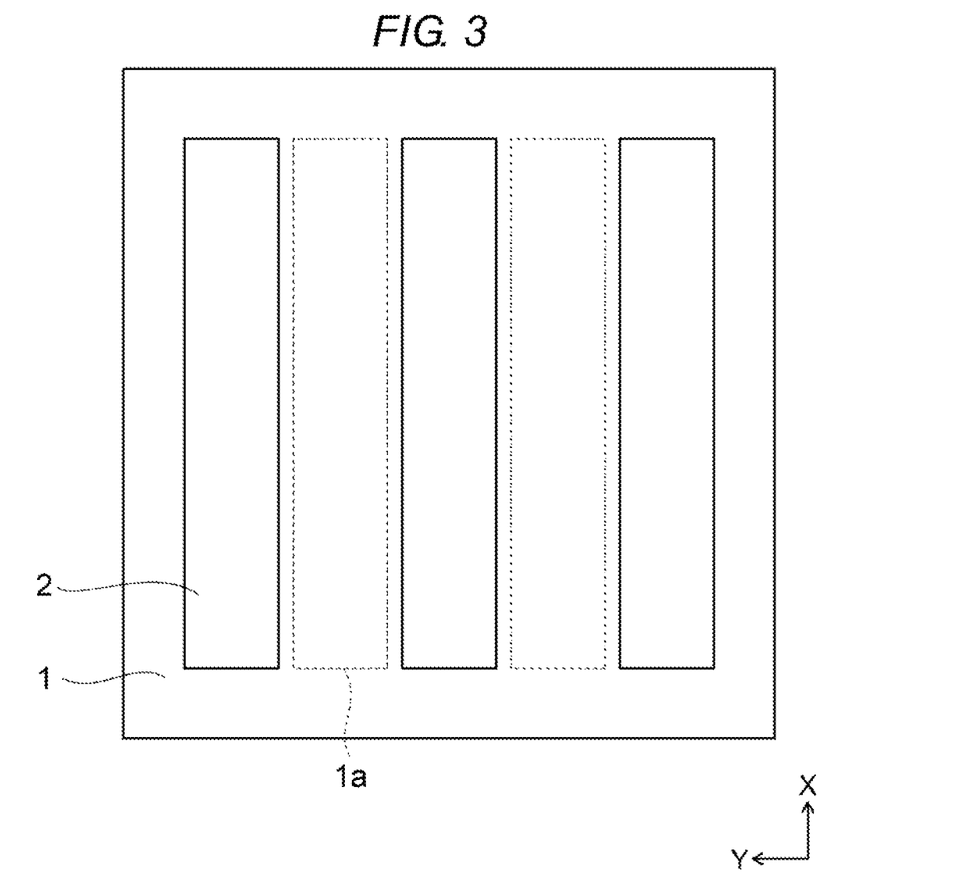
FIG. 3 is a bottom view which illustrates a portion of the semiconductor device according to the first embodiment.

Alternatively, the n⁺-type semiconductor region 1 may include a plurality of linear regions extending in the X direction and a peripheral region surrounding the plurality of linear regions, and the p⁺-type semiconductor region 2 may be a region which is provided in the n⁺-type semiconductor region 1 and extends linearly in the X direction.

A structure according to this embodiment, when viewing the n⁺-type semiconductor region 1 and the p⁺-type semiconductor region 2 from the side of the cathode electrode 8, is illustrated in FIG. 3. In the structure illustrated in FIG. 3, the n⁺-type semiconductor region 1 extends linearly in the X direction and the Y direction, and the p⁺-type semiconductor region 2 extends linearly in the X direction. The n⁺-type semiconductor region 1 also includes a plurality of n⁺-type semiconductor regions 1a formed between each pair of adjacent p⁺-type semiconductor regions 2. Likewise, the n-type semiconductor region 4 includes a plurality of regions extending in the X direction and a region surrounding the plurality of regions in the same manner as the n⁺-type semiconductor region 1. The n-type semiconductor region 3 may be a region which is provided in discrete regions in the n-type semiconductor region 4 and overlies and extends in the X direction in the same manner as the p⁺-type semiconductor region 2.

The p⁻-type semiconductor region 6 may also be a region which includes a plurality of regions extending linearly in the X direction and a region surrounding the plurality of regions. Accordingly, the p⁺-type semiconductor region 7 is a region which is formed between the p⁻-type semiconductor region 6 and extends linearly in the X direction.

Next, a method of manufacturing the semiconductor device 100 illustrated in FIG. 1 will be described with reference to FIGS. 4A to 4D.

FIGS. 4A to 4D are partial cross-sectional views which illustrate a method of manufacturing the semiconductor device 100 according to the first embodiment.

Figure 4A:
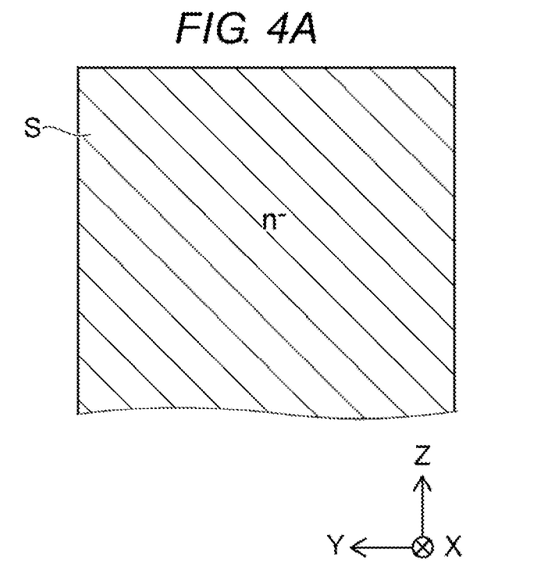
FIGS. 4A to 4D are process cross-sectional views which illustrate a method of manufacturing the semiconductor device according to the first embodiment.

First, as illustrated in FIG. 4A, an n⁻-type substrate S is prepared. The substrate S is, for example, a silicon substrate.

Figure 4B:
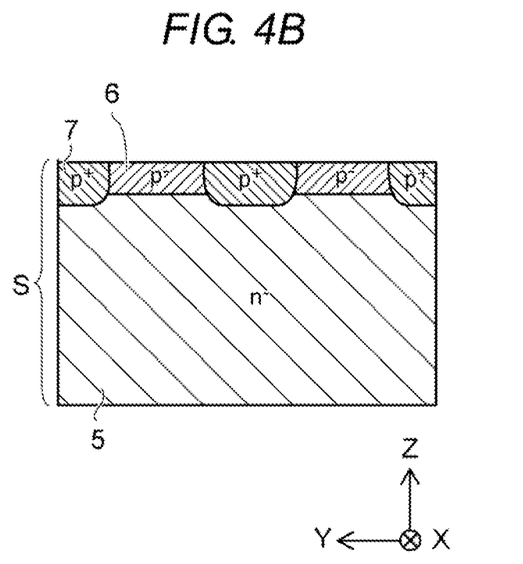

Then, as illustrated in FIG. 4B, the p⁻-type semiconductor region 6 and the p⁺-type semiconductor region 7 are formed by implanting p-type dopants into the front surface side of the substrate S. The p⁺-type semiconductor region 7 is formed by further implanting the p-type dopant only into specific regions after forming the p⁻-type semiconductor region 6 over the entire front surface of the substrate S. Alternatively, after forming the p⁻-type semiconductor region 6 by ion-implanting the p-type dopant only into specific regions of the front surface of the substrate S, the p⁺-type semiconductor region 7 may be formed by ion-implanting the p-type dopants into another specific region of the substrate S.

Next, the rear surface of the substrate S is polished.

Figure 4C:
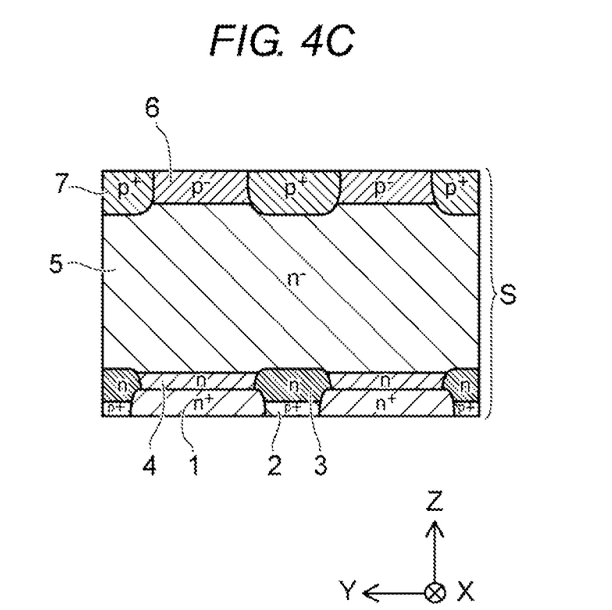

Then, as illustrated in FIG. 4C, the n⁺-type semiconductor region 1, the p⁺-type semiconductor region 2, the n-type semiconductor region 3, and the n-type semiconductor region 4 are formed by sequentially ion-implanting an n-type dopant and the p-type impurity into a specific region from the rear surface of the substrate S.

As a dopant for forming each semiconductor region, the dopants described in a description of each semiconductor region above may be used.

The order of formation of each semiconductor region does not matter. However, implanting dopants with a high diffusion coefficient is performed after implanting dopants with a low diffusion coefficient, and thereby the size of each semiconductor region may be controlled and/or a dopant concentration of each semiconductor region is controlled.

Figure 4D:
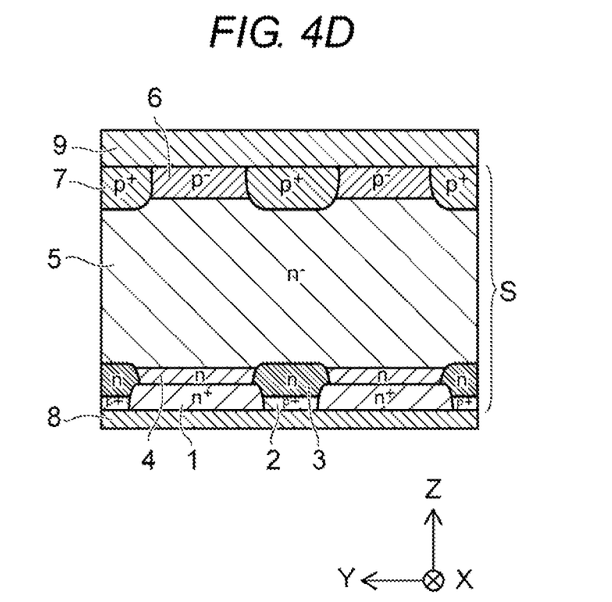

Then, as illustrated in FIG. 4D, the semiconductor device 100 is obtained by forming the anode electrode 9 on the front surface side of the substrate S and forming the cathode electrode 8 on the rear surface side of the substrate S.

A region of the substrate S other than each semiconductor region formed on the substrate S corresponds to the n⁻-type semiconductor region 5.

Then, an operation where the semiconductor device 100 is incorporated into an electric circuit will be described.

When a potential higher than a potential of the cathode electrode 8 is applied to the anode electrode 9, a forward voltage is applied to the semiconductor device 100. At this time, holes are formed in the n⁻-type semiconductor region 5 from the anode electrode 9 through the p⁻-type semiconductor region 6 and the p⁺-type semiconductor region 7, and electrons move to the n⁻-type semiconductor region 5 from the cathode electrode 8 through the n⁺-type semiconductor region 1.

When the forward voltage to the semiconductor device 100 is turned off, among excessive carriers accumulated in each semiconductor region of the substrate S, electrons are discharged through the cathode electrode 8 and holes are discharged through the anode electrode 9.

Then, when the electrons pass through the n-type semiconductor region 3 toward the cathode electrode 8, a potential of the n-type semiconductor region 3 is lowered. When a potential difference between the p⁺-type semiconductor region 2 and the n-type semiconductor region 3 is equal to or less than a built-in potential of a diode formed in the p⁺-type semiconductor region 2 and the n-type semiconductor region 3, a hole is formed in the n⁻-type semiconductor region 5 through the n-type semiconductor region 3 from the p⁺-type semiconductor region 2.

The hole moved from the p⁺-type semiconductor region 2 and the electron flowing toward the n⁺-type semiconductor region 1 are recombined. Thus, a moderate change in a current flowing in the semiconductor device 100 occurs when the forward voltage to the semiconductor device 100 is turned off. When the moderate change in the current flowing in the semiconductor device 100 occurs, a surge voltage applied between the cathode electrode 8 and the anode electrode 9 is reduced by an inductance component in a circuit in which the semiconductor device 100 is incorporated. As a result, it is less likely that the semiconductor device is destroyed by a high surge voltage, which is a so-called surge destruction.

However, when the p⁺-type semiconductor region 2 is provided and a reverse voltage is applied to the semiconductor device 100 at a high temperature, a problem occurs when a hole is formed in the n⁻-type semiconductor region 5 through the p⁺-type semiconductor region 2 to cause a leakage current to flow. In particular, when the semiconductor device 100 operates at a high temperature, for example, 150° C. or more, a large leakage current from the p⁺-type semiconductor region 2 is observed.

Here, first, it is considered that the n-type semiconductor region 4 containing a dopant such as P or As is formed over an entire surface on the n⁺-type semiconductor region 1 and the p⁺-type semiconductor region 2.

In order to reduce a leakage current described above from the p⁺-type semiconductor region 2 at high temperatures, it is necessary to set the dopant concentration of the n-type semiconductor region 4 so that the hole formed from the p⁺-type semiconductor region 2 may be sufficiently neutralized in the n-type semiconductor region 4.

On the other hand, the dopant such as P or As contained in the n-type semiconductor region 4 has a high ionization rate even at a room temperature. Accordingly, a carrier density in the n-type semiconductor region 4 at a room temperature is also high.

When the forward voltage to the semiconductor device 100 is turned off, the hole is formed in the n⁻-type semiconductor region from the p⁺-type semiconductor region 2 through the n-type semiconductor region 4. At this time, the number of holes formed from the p⁺-type semiconductor region 2 is less than the number of holes formed from the p⁺-type semiconductor region 2 when a reverse voltage is applied to the semiconductor device 100 at a high temperatures. Therefore, when setting the dopant concentration of the n-type semiconductor region 4 so as to reduce a leakage current at a high temperatures, most of the holes formed from the p⁺-type semiconductor region 2 at a room temperature are recombined with electrons in the n-type semiconductor region 4. As a result, a large surge voltage is generated in the semiconductor device 100 without sufficiently reducing an amount of electrons flowing toward the n⁺-type semiconductor region 1.

According to the embodiment, the n-type semiconductor region 3, which contains a dopant such as Se or S at a deeper or higher level than a dopant such as P or As contained in the n-type semiconductor region 4, is provided on the p⁺-type semiconductor region 2. When a forward voltage to the semiconductor device 100 is turned off, a hole is formed in the n⁻-type semiconductor region from the p⁺-type semiconductor region 2 through the n-type semiconductor region 3.

At high temperatures, an ionization rate of Se or S is equal to an ionization rate of P or As. On the other hand, at a room temperature, an ionization rate of Se or S is lower than an ionization rate of P or As.

Accordingly, even when providing the n-type semiconductor region 3 having a sufficient concentration to suppress the leakage current from the p⁺-type semiconductor region 2 at high temperatures and when the forward voltage to the semiconductor device 100 is turned off at a room temperature, it is possible to reduce a possibility that the holes formed from the p⁺-type semiconductor region 2 are recombined in the n-type semiconductor region 3. As a result, it is possible to suppress an increase in the surge voltage when the forward voltage to the semiconductor device 100 is turned off.

Moreover, it is possible to reduce temperature dependence of an on-resistance caused by the n-type semiconductor region 3 on the n⁺-type semiconductor region 1 by providing the n-type semiconductor region 4, which contains P or As at a shallower level than Se and S on the n⁺-type semiconductor region 1. Since P and As have are provided at shallow level, an ionization rate thereof at room temperature is substantially the same as an ionization rate at high temperatures.

In contrast, if a temperature dependence of the ionization rate of dopants contained in the n-type semiconductor region 4 is high, a temperature dependence of a carrier density of the n-type semiconductor region 4 is also high. As a result, a temperature dependence of on-resistance of the semiconductor device 100 when a forward voltage is applied to the semiconductor device 100 is also high.

As described above, the n-type semiconductor region 4 is provided on the n⁺-type semiconductor region 1, and the n-type semiconductor region 3, which contains a dopant at a deeper level than a dopant contained in the n-type semiconductor region 4, is provided on the p⁺-type semiconductor region 2. Thus, it is possible to reduce the leakage current from the p⁺-type semiconductor region 2 at a high temperature and to reduce the temperature dependence of on-resistance while suppressing an increase in a surge voltage at a room temperature.

Moreover, it is preferable to use Se or S as a dopant at a deeper level than a level of a dopant such as P and As.

As described in an example of a method of manufacturing the semiconductor device 100, the n⁺-type semiconductor region 1, the p⁺-type semiconductor region 2, the n-type semiconductor region 3, and the n-type semiconductor region 4 are formed at the rear surface side of the substrate S after the p⁻-type semiconductor region 6 and the p⁺-type semiconductor region 7 are formed at the front surface side of the substrate S. The n-type semiconductor region 3 also functions as a field stop region for forming a depletion layer extending from the n⁻-type semiconductor region 5. Accordingly, it is preferable that the n-type semiconductor region 3 extends to a deep position from the rear surface of the substrate S.

On the other hand, since the p⁻-type semiconductor region 6 and the p⁺-type semiconductor region 7 have already been formed at the front surface side of the substrate S, it is preferable that a heat treatment performed on the substrate S be performed for a short period of time.

Among dopants with a higher level than the level of P or As, Se and S have a large diffusion coefficient, and it is possible to form a semiconductor region extending to a deep position from the rear surface of the substrate S using a heat treatment for a shorter period of time than other dopants.

Furthermore, a dimension of the n-type semiconductor region 3 in the Y direction is longer than a dimension of the p⁺-type semiconductor region 2 in the Y direction in the embodiment.

By adopting this configuration, it is possible to reliably recombine the hole formed from the $p^+$-type semiconductor region 2 at a high temperature with electrons of the n-type semiconductor region 3. Therefore, it is possible to further reduce a leakage current when the semiconductor device 100 operates at a high temperature.

In addition, the n-type semiconductor region 3 extends toward the anode electrode 9 side further than the n-type semiconductor region 4, and thereby it is possible to reduce a possibility that avalanche breakdown occurs in the semiconductor device 100.

In a conventional device, for example, the n-type semiconductor region 4 is provided to overlie and cover the n-type semiconductor region 3. Accordingly, a current filament occurring when a forward voltage is applied to the semiconductor device 100 occurs in any place of the $n^-$-type semiconductor region 5 on the n-type semiconductor region 4. Then, the position in which the current filament occurs is not fixed, but the place in which the current filament occurs is changed over time by an influence of the temperature dependence, by the impact of the ionization rate, and a temperature gradient of a device. Accordingly, the current filament occurs at any place having low avalanche resistance, and avalanche breakdown occurs.

In contrast, according to the embodiment, the n-type semiconductor region 3 extends toward the anode electrode 9 side further than the n-type semiconductor region 4, and thereby, a current filament occurring when a forward voltage is applied to the semiconductor device 100 is likely to occur in a vicinity of the n-type semiconductor region 3. In addition, even when a place in which the current filament occurs is changed over time, the current filament is likely to occur in the vicinity of the n-type semiconductor region 3 again. Accordingly, it is possible to reduce a possibility that the current filament occurs in a place having a low avalanche resistance, and to reduce a possibility that avalanche breakdown occurs in the semiconductor device 100.

Second Embodiment

Figure 5:
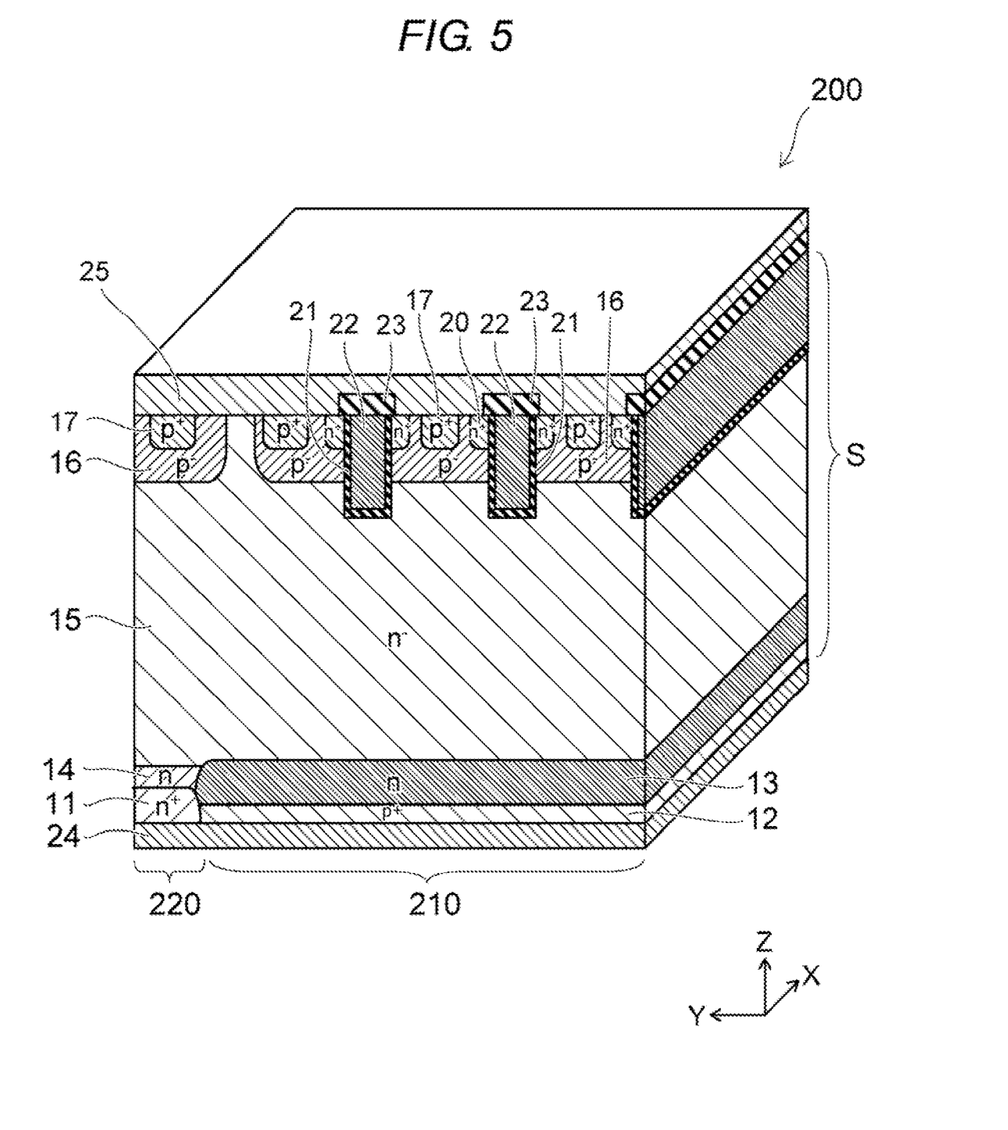
FIG. 5 is a perspective cross-sectional view which illustrates a portion of a semiconductor device according to a second embodiment.

FIG. 5 is a perspective cross-sectional view illustrating a part of a semiconductor device 200 according to a second embodiment.

The semiconductor device 200 is, for example, an RC-IGBT.

The semiconductor device 200 includes a first electrode (collector electrode 24), a first semiconductor region of a first conductivity type ($n^+$-type semiconductor region 11), a second semiconductor region of a second conductivity type ($p^+$-type semiconductor region 12), a third semiconductor region of a first conductivity type (n-type semiconductor region 14), a fourth semiconductor region of a first conductivity type (n-type semiconductor region 13), a fifth semiconductor region of a first conductivity type ($n^-$-type semiconductor region 15), a sixth semiconductor region of a second conductivity type ($p^+$-type semiconductor region 17), a seventh semiconductor region of a second conductivity type ($p^-$-type semiconductor region 16), an eighth semiconductor region of a first conductivity type ($n^+$-type semiconductor region 20), a gate insulation film 21, a gate electrode 22, and a second electrode (emitter electrode 25).

The semiconductor device 200 includes an IGBT 210 which is configured with the $p^+$-type semiconductor region 12, the $n^-$-type semiconductor region 15, the $p^-$-type semiconductor region 16, the $n^+$-type semiconductor region 20, the gate insulation film 21, the gate electrode 22, the collector electrode 24, and the emitter electrode 25.

In addition, the semiconductor device 200 includes a diode 220 which is configured with the $n^+$-type semiconductor region 11, the n-type semiconductor region 13, the n-type semiconductor region 14, the $n^-$-type semiconductor region 15, the $p^-$-type semiconductor region 16, the $p^+$-type semiconductor region 17, the collector electrode 24, and the emitter electrode 25.

The $n^+$-type semiconductor region 11 may adopt the same configuration as the $n^+$-type semiconductor region 1 according to the first embodiment. The $p^+$-type semiconductor region 12 may adopt the same configuration as the $p^+$-type semiconductor region 2 according to the first embodiment. The n-type semiconductor region 13 may adopt the same configuration as the n-type semiconductor region 3. The n-type semiconductor region 14 may adopt the same configuration as the n-type semiconductor region 4 according to the first embodiment. The $n^-$-type semiconductor region 15 may adopt the same configuration as the $n^-$-type semiconductor region 5 according to the first embodiment. The $p^-$-type semiconductor region 16 may adopt the same configuration as the $p^-$-type semiconductor region 6 according to the first embodiment. The $p^+$-type semiconductor region 17 may adopt the same configuration as the $p^+$-type semiconductor region 7 according to the first embodiment.

The $n^+$-type semiconductor region 20 is selectively formed on the $p^-$-type semiconductor region 16 at a front surface side of a substrate S. A plurality of the $n^+$-type semiconductor regions 20 are provided in a Y direction. In addition, the $n^+$-type semiconductor regions 20 extend in an X direction. A dopant concentration of a first conductivity type of the $n^+$-type semiconductor region 20 is higher than a dopant concentration of a first conductivity type of the $n^-$-type semiconductor region 15.

The gate electrode 22 is formed adjacent to the $n^-$-type semiconductor region 15, the $p^-$-type semiconductor region 16, and the $n^+$-type semiconductor region 20 through the gate insulation film 21 in the Y direction. A plurality of the gate electrodes 22 are provided in the Y direction. Moreover, the gate electrodes 22 extend in the X direction.

An interlayer insulation film 23 is provided on the gate electrode 22 so as to insulate the gate electrode 22 from the emitter electrode 25.

The collector electrode 24 is electrically connected to the $n^+$-type semiconductor region 11 and the $p^+$-type semiconductor region 12.

The emitter electrode 25 is electrically connected to the $p^+$-type semiconductor region 17 and the $n^+$-type semiconductor region 20.

Next, an operation of the semiconductor device 200 will be described.

When a potential equal to or greater than a threshold value is applied to the gate electrode 22, a channel (inversion layer) is formed in the vicinity of an interface between the gate insulation films 21 in the $n^-$-type semiconductor region 15. A channel is formed by applying a positive potential with respect to a potential of the emitter electrode 25 and the collector electrode 24, and thereby electrons are formed in the $n^-$-type semiconductor region 15 from the $n^+$-type semiconductor region 20 through the channel. Accordingly, the semiconductor device 200 is in an on state. At this time, a hole is formed from the $p^+$-type semiconductor region 12 into the $n^-$-type semiconductor region 15. The hole formed in the $n^-$-type semiconductor region 15 flows to the emitter electrode 25 from the $p^+$-type semiconductor region 17 through the $p^-$-type semiconductor region 16.

Thereafter, when a potential less than a threshold value is applied to the gate electrode 22, the inversion layer in the p⁻-type semiconductor region 16 disappears, and the semiconductor device 200 is in an off state. In the off state, excessive holes accumulated in the n⁻-type semiconductor region 15 are discharged to the collector electrode 24 through the p⁺-type semiconductor region 12.

At this time, a positive voltage with respect to the collector electrode 24 is applied to the emitter electrode 25 by an inductance component of a circuit to which the semiconductor device 200 is connected. In this case, the emitter electrode 25 is set to be an anode electrode and the collector electrode 24 is set to be a cathode electrode, and a current flows from the emitter electrode 25 to the collector electrode 24. That is, the diode 220, which is configured with the p⁻-type semiconductor region 16 and the p⁺-type semiconductor region 17, the n⁺-type semiconductor region 11, the n-type semiconductor region 14, the n-type semiconductor region 13, and the n⁻-type semiconductor region 15, operates as a free wheel diode (FWD).

In the exemplary embodiment, in the same manner as the first embodiment, the n-type semiconductor region 13, which contains a dopant having a deeper level than a dopant contained in the n-type semiconductor region 14, is provided on the p⁺-type semiconductor region 12, and thereby the diode 220 included in the semiconductor device 200 may reduce the leakage current from the p⁺-type semiconductor region 12 at a high temperature, and reduce the temperature dependence of on-resistance while suppressing an increase in the surge voltage at room temperature.

Modification Example

A modification example of the second embodiment will be described with reference to FIG. 6.

Figure 6:
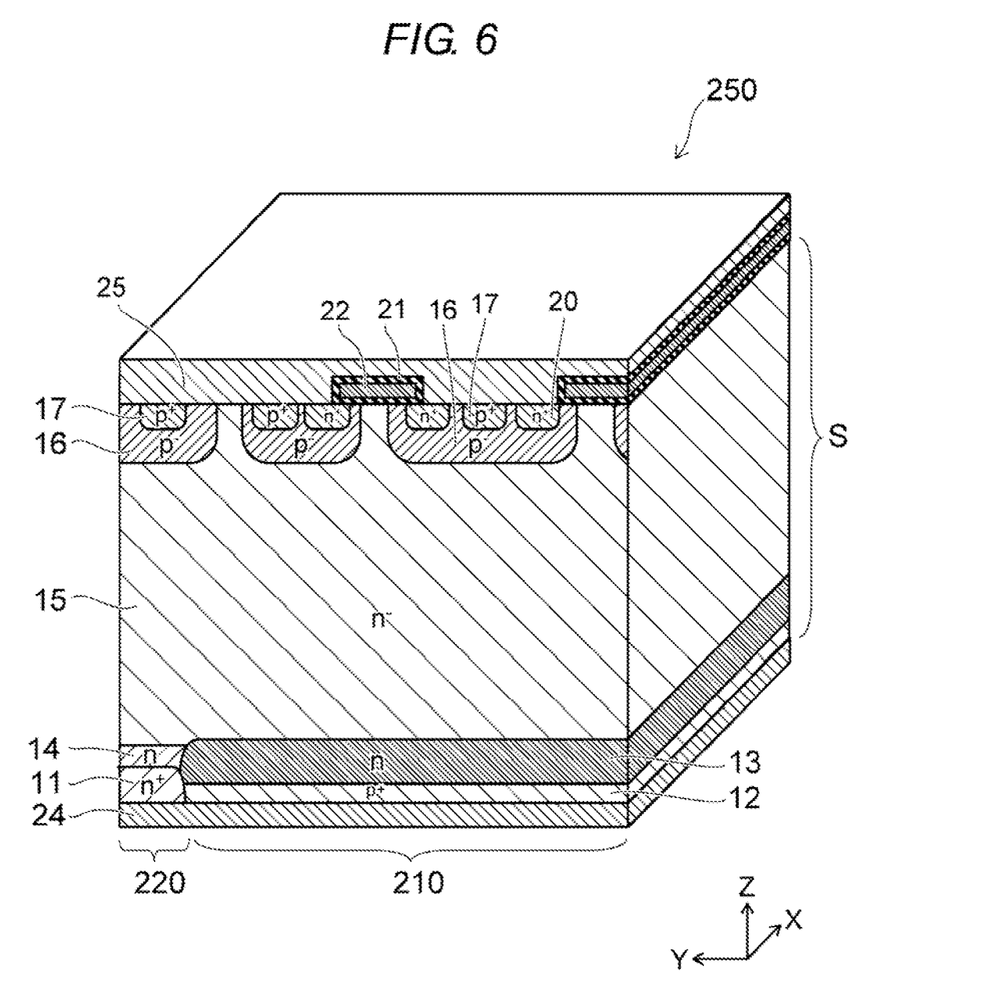
FIG. 6 is a perspective cross-sectional view which illustrates a portion of a semiconductor device according to a second embodiment that is further modified.

FIG. 6 is a perspective cross-sectional view illustrating a part of the semiconductor device 250 according to the second embodiment.

The semiconductor device 250 is, for example, an RC-IGBT.

The semiconductor device 200 has a structure of a so-called trench gate type having a gate formed in a trench formed on a semiconductor substrate.

In contrast, the semiconductor device 250 has a structure of a so-called planar type where a gate electrode 22 is formed on the semiconductor substrate surface.

In the semiconductor device 250, in the same manner as the first embodiment, the diode 220 included in the semiconductor device 250 may reduce the leakage current from the p⁺-type semiconductor region 12 at a high temperature, and reduce the temperature dependence of on-resistance while suppressing an increase in the surge voltage at room temperature.

In the structural example of the semiconductor device 200 and 250 illustrated in FIGS. 5 and 6 respectively, the IGBT 210 only is formed at one side of the device and the diode 220 only is formed at the other side of the device along the Y direction.

However, the embodiment is not limited to the example illustrated in FIGS. 5 and 6, and, for example, a structure in which the IGBT 210 and the diode 220 are alternately formed in the X direction and the Y direction may be also used.

A relative magnitude of the dopant concentration in each semiconductor region described in each embodiment may be checked using, for example, a scanning capacitance microscope (SCM).

In addition to the embodiments described above, the exemplary embodiment may be also applied to a semiconductor integrated circuit device, or the like, which includes a built-in power device according to each embodiment described above.

Moreover, the embodiments described above describe a case of using silicon as a material of the semiconductor substrate. However, the exemplary embodiment is not limited thereto, but is applicable to a semiconductor device using, for example, silicon carbide as a material of the semiconductor substrate. In addition, phosphorus or boron is exemplified as a dopant material; however, the dopant material may be appropriately modified depending on the material of the semiconductor substrate used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor region of a first conductivity type;
   a second semiconductor region of a second conductivity type that is adjacent to the first semiconductor region;
   a third semiconductor region of the first conductivity type that is provided on the first semiconductor region, and has a dopant concentration that is lower than a dopant concentration of the first semiconductor region;
   a fourth semiconductor region of the first conductivity type that is provided on the second semiconductor region adjacent to the third semiconductor region, and having a dopant that extends to a level that is deeper than a level of a dopant contained in the third semiconductor region;
   a fifth semiconductor region of the first conductivity type that is provided on the third semiconductor region and the fourth semiconductor region; and
   a sixth semiconductor region of the second conductivity type that is provided on the fifth semiconductor region.

2. The device according to claim 1,
   wherein a dimension of the fourth semiconductor region in a first direction from the first semiconductor region to the second semiconductor region is longer than a dimension of the second semiconductor region in the first direction.

3. The device according to claim 2,
   wherein a surface portion of the fourth semiconductor region extends beyond a plane of a surface portion of the third semiconductor region in a second direction.

4. The device according to claim 2,
   wherein a dopant contained in the first semiconductor region is a phosphorus or arsenic,
   the dopant contained in the third semiconductor region is a phosphorus or arsenic, and
   the dopant contained in the fourth semiconductor region is a selenium or sulfur.

5. The device according claim 2, further comprising:
   a seventh semiconductor region of the second conductivity type provided on the fifth semiconductor region;
   an eighth semiconductor region of the first conductivity type that is selectively provided on the seventh semiconductor region and has a dopant concentration higher than a dopant concentration of the fifth semiconductor region; and a gate electrode disposed and on a gate insulation film in the fifth semiconductor region, the seventh semiconductor region, and the eighth semiconductor region, wherein the sixth semiconductor region is selectively provided on the seventh semiconductor region, and has a dopant concentration higher than a dopant concentration of the seventh semiconductor region.

6. The device according to claim 1,
wherein a surface portion of the fourth semiconductor region extends beyond a plane of a surface portion of the third semiconductor region in a second direction.

7. The device according to claim 6,
wherein a dopant contained in the first semiconductor region is a phosphorus or arsenic,
the dopant contained in the third semiconductor region is a phosphorus or arsenic, and
the dopant contained in the fourth semiconductor region is a selenium or sulfur.

8. The device according claim 6, further comprising:
a seventh semiconductor region of the second conductivity type formed on the fifth semiconductor region;
an eighth semiconductor region of the first conductivity type that is selectively provided on the seventh semiconductor region and has a dopant concentration higher than a dopant concentration of the fifth semiconductor region; and
a gate electrode disposed on a gate insulation film in the fifth semiconductor region, the seventh semiconductor region, and the eighth semiconductor region,
wherein the sixth semiconductor region is selectively provided on the seventh semiconductor region, and has a dopant concentration higher than a dopant concentration of the seventh semiconductor region.

9. The device according to claim 1,
wherein a dopant contained in the first semiconductor region is a phosphorus or arsenic,
the dopant contained in the third semiconductor region is a phosphorus or arsenic, and
the dopant contained in the fourth semiconductor region is a selenium or sulfur.

10. The device according claim 9, further comprising:
a seventh semiconductor region of the second conductivity type provided on the fifth semiconductor region;
an eighth semiconductor region of the first conductivity type selectively provided on the seventh semiconductor region and has a dopant concentration higher than a dopant concentration of the fifth semiconductor region; and
a gate electrode disposed on a gate insulation film in the fifth semiconductor region, the seventh semiconductor region, and the eighth semiconductor region,
wherein the sixth semiconductor region is selectively provided on the seventh semiconductor region, and has a dopant concentration higher than a dopant concentration of the seventh semiconductor region.

11. The device according claim 1, further comprising:
a seventh semiconductor region of the second conductivity type provided on the fifth semiconductor region;
an eighth semiconductor region of the first conductivity type that is selectively provided on the seventh semiconductor region and has a dopant concentration higher than a dopant concentration of the fifth semiconductor region; and
a gate electrode that is disposed on a gate insulation film in the fifth semiconductor region, the seventh semiconductor region, and the eighth semiconductor region, wherein the sixth semiconductor region is selectively provided on the seventh semiconductor region, and has a dopant concentration higher than a dopant concentration of the seventh semiconductor region.

12. A semiconductor device comprising:
a first semiconductor region of a first conductivity type;
a second semiconductor region of a second conductivity type that is adjacent to the first semiconductor region;
a third semiconductor region of the first conductivity type that is provided on the first semiconductor region, and has a dopant concentration that is lower than a dopant concentration of the first semiconductor region;
a fourth semiconductor region of the first conductivity type that is provided on the second semiconductor region adjacent to the third semiconductor region, and has a dopant that extends to a level that is deeper than a level of a dopant contained in the third semiconductor region, wherein a dimension of the fourth semiconductor region in a first direction from the first semiconductor region to the second semiconductor region is longer than a dimension of the second semiconductor region in the first direction;
a fifth semiconductor region of the first conductivity type that is provided on the third semiconductor region and the fourth semiconductor region; and
a sixth semiconductor region of the second conductivity type that is provided on the fifth semiconductor region.

13. The device according to claim 12,
wherein a surface portion of the fourth semiconductor region extends beyond a plane of a surface portion of the third semiconductor region in a second direction.

14. The device according to claim 12,
wherein a dopant contained in the first semiconductor region is a phosphorus or arsenic,
the dopant contained in the third semiconductor region is a phosphorus or arsenic, and
the dopant contained in the fourth semiconductor region is a selenium or sulfur.

15. The device according claim 12, further comprising:
a seventh semiconductor region of the second conductivity type provided on the fifth semiconductor region;
an eighth semiconductor region of the first conductivity type that is selectively provided on the seventh semiconductor region and has a dopant concentration higher than a dopant concentration of the fifth semiconductor region; and
a gate electrode provided on a gate insulation film in the fifth semiconductor region, the seventh semiconductor region, and the eighth semiconductor region,
wherein the sixth semiconductor region is selectively provided on the seventh semiconductor region, and has a dopant concentration higher than a dopant concentration of the seventh semiconductor region.

16. A method of forming a semiconductor device, the method comprising:
forming a first semiconductor region of a first conductivity type on a substrate;
forming a second semiconductor region of a second conductivity type adjacent to the first semiconductor region;
forming a third semiconductor region of the first conductivity type on the first semiconductor region, the third semiconductor region having a dopant concentration that is lower than a dopant concentration of the first semiconductor region;
forming a fourth semiconductor region of the first conductivity type on the second semiconductor region adjacent to the third semiconductor region, the fourth semiconductor region having a doped region that extends to a level that is deeper than a level of a doped region in the third semiconductor region;

forming a fifth semiconductor region of the first conductivity type on the third semiconductor region and the fourth semiconductor region; and forming a sixth semiconductor region of the second conductivity type on the fifth semiconductor region.

17. The method of claim 16,
wherein a dimension of the fourth semiconductor region in a first direction from the first semiconductor region to the second semiconductor region is longer than a dimension of the second semiconductor region in the first direction.

18. The method of claim 16,
wherein a surface portion of the fourth semiconductor region extends beyond a plane of a surface portion of the third semiconductor region in a second direction.

19. The method of claim 16,
wherein a dopant contained in the first semiconductor region is a phosphorus or arsenic, the dopant contained in the third semiconductor region is a phosphorus or arsenic, and the dopant contained in the fourth semiconductor region is a selenium or sulfur.

20. The method of claim 16, further comprising:
forming a seventh semiconductor region of the second conductivity type on the fifth semiconductor region;

selectively forming an eighth semiconductor region of the first conductivity type on the seventh semiconductor region, the eighth semiconductor region having a dopant concentration higher than a dopant concentration of the fifth semiconductor region; and forming a gate electrode on a gate insulation film in the fifth semiconductor region, the seventh semiconductor region, and the eighth semiconductor region, wherein the sixth semiconductor region is selectively formed on the seventh semiconductor region, and has a dopant concentration higher than a dopant concentration of the seventh semiconductor region.

\* \* \* \* \*